United States Patent
Oh et al.

(10) Patent No.: US 6,670,689 B2
(45) Date of Patent: Dec. 30, 2003

(54) SEMICONDUCTOR DEVICE HAVING SHALLOW TRENCH ISOLATION STRUCTURE

(75) Inventors: Yong-Chul Oh, Kyungki-do (KR); Jun-Yong Roh, Incheon (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/990,417

(22) Filed: Nov. 21, 2001

(65) Prior Publication Data

US 2002/0070430 A1 Jun. 13, 2002

(30) Foreign Application Priority Data

Dec. 9, 2000 (KR) ............................................. 00-74914

(51) Int. Cl.[7] .......................... H01L 29/00; H01L 21/76
(52) U.S. Cl. ...................... 257/506; 438/424; 438/437
(58) Field of Search .......................... 257/506; 438/424, 438/437, 427, 435

(56) References Cited

U.S. PATENT DOCUMENTS 4,631,803 A * 12/1986 Hunter et al. ................ 438/426
6,255,194 B1 * 7/2001 Hong .......................... 438/435

* cited by examiner

*Primary Examiner*—Amir Zarabian
*Assistant Examiner*—Kiesha Rose
(74) *Attorney, Agent, or Firm*—Marger Johnson & McCollom, P.C.

(57) ABSTRACT

A semiconductor device having a shallow trench isolation (STI) structure, which reduces leakage current between adjacent P-FETs, and a manufacturing method thereof. The device comprises a semiconductor substrate having first and second trenches, the first trench being formed in a cell area; a first sidewall oxide layer formed on inner surfaces of the first and second trenches; a second sidewall oxide layer formed on a surface of the first sidewall oxide layer in the second trench; a first relief liner formed on the first sidewall oxide layer in the first trench; a second relief liner formed on the first relief liner in the first trench, and also formed on the second sidewall oxide layer in the second trench; and a dielectric material formed within the first and second trenches.

14 Claims, 6 Drawing Sheets

SEMICONDUCTOR DEVICE HAVING SHALLOW TRENCH ISOLATION STRUCTURE

BACKGROUND OF THE INVENTION

1. Field of the Invention

The present invention relates to a semiconductor device having a shallow trench isolation (hereinafter, referred to as STI) structure and a method for manufacturing the same.

2. Description of the Related Art

Much progress has been made in increasing speed and integration of semiconductor devices. Along with this progress, higher-density patterns and reduction in size has become increasingly important. Wide isolation regions in semiconductor devices have also made higher-density patterns and reduced sizes a requirement.

Local oxidation of silicon (LOCOS) layers have been mainly used as conventional isolation layers of semiconductor devices. However, bird's beak configurations are created at the edges of the isolation layer by the LOCOS method and thus the area of active regions is reduced and current leakage occurs.

Recently, shallow trench isolation (STI) layers having narrow widths and excellent isolation characteristics have been proposed and a semiconductor device having such STI structure will be described with reference to FIG. 1.

Referring to FIG. 1, a blocking pattern (not shown) is formed on a semiconductor substrate 10 to expose an isolation region. The semiconductor substrate 10 can be defined as a cell area, a core area and a peripheral area. In addition, the blocking pattern may be a stack of an oxide layer and a silicon nitride layer. The exposed semiconductor substrate 10 is etched to a predetermined depth using the blocking pattern as a mask, thereby forming trenches $t_1$ and $t_2$ therein. The trench $t_1$ is formed in the cell area and the trench $t_2$ defines a P-channel field effect transistor (P-FET) area in the core or peripheral areas. A dry etching process is performed for forming the trenches $t_1$ and $t_2$ using a plasma.

The dry etching process for forming the trenches $t_1$ and $t_2$, however, may cause silicon lattice defects and damage inner surfaces of the trenches $t_1$ and $t_2$. Conventionally, to reduce such silicon lattice defects and damage, a sidewall oxide layer 12 is formed by thermally oxidizing the inner surfaces of the trenches $t_1$ and $t_2$. Also, the formation of a sidewall oxide layer 12 smoothens sharp corners of the trenches $t_1$ and $t_2$.

Afterwards, a silicon nitride liner 14 is formed on the surface of the sidewall oxide layer 12. As is well known, the silicon nitride liner 14 prevents the generation of stress caused by the coefficient of thermal expansion (CTE) mismatch between the semiconductor substrate 10 formed of silicon and a silicon oxide layer with which the trenches $t_1$ and $t_2$ will be filled.

A dielectric material, for example, a high-density-plasma (HDP) dielectric layer is deposited over the resultant semiconductor substrate 10 to completely fill the trenches $t_1$ and $t_2$. Next, chemical mechanical polishing (hereinafter, referred to as "CMP") is performed on the HDP dielectric layer and the blocking pattern to expose the surface of the semiconductor substrate 10. This completes the formation of an STI layer 16.

However, semiconductor devices having the conventional STI structure causes the following problems. With reference to FIGS. 2A and 2B, since hot carriers of a highly integrated semiconductor MOS transistor generally have high energy, they bounce to a thin gate oxide layer 22 or easily penetrate through the sidewall oxide layer 12 into the STI layer 16. The hot carriers penetrating into the STI layer 16 are mainly negative charges, namely, electrons 30, which are easily trapped in the silicon nitride liner 14 in the STI layer 16 and on the interface between the silicon nitride liner 14 and the sidewall oxide layer 12. At this time, the electrons 30 are closely trapped since the sidewall oxide layer 12 is remarkably thin as described above. In the case where the electrons 30 are dense with the edge of the STI layer 16, positive charges of the semiconductor substrate 10 on which MOS transistors are formed, namely, holes 32 are induced to the circumference of the STI layer 16. At this time, since the electrons 30 are closely trapped in the silicon nitride liner 14 and on the interface between the silicon nitride liner 14 and the sidewall oxide layer 12, the holes 32 in the semiconductor substrate 10 are densely gathered together.

As shown in FIG. 2A since in an N-channel field effect transistor (N-FET) major carriers are the electrons 30, a path is not formed between n-type junction areas 26a and 26b in which the electrons 30 function as major carriers even though the holes 32 are dense with the circumference of the STI layer 16.

As is well known, since, in a P-FET, major carriers are the holes 32, as shown in FIG. 2B, the holes 32, which are densely populated at the circumference of the STI layer 16, form a current path I connecting p-type junction areas 28a and 28b isolated by the STI layer 16. Consequently, due to the current path I, although p-type junction areas 28a and 28b are isolated by the STI layer 16, leakage current, such as abnormally increased standby current after burn-in, occurs between adjacent P-FETs, thereby deteriorating the characteristics of the P-FETS. Here, reference numeral 24 denotes a gate electrode of a MOSFET.

Furthermore, if a P-FET (not shown) is on the interface between the STI layer 16 and an active region, a channel area of the P-FET abuts the silicon nitride liner 14, in which the electrons are trapped, by the thin sidewall oxide layer 12. Consequently, the electrons trapped in the silicon nitride liner 14 easily induce holes to the channel area of the P-FET in the interface. Also, the holes induced in turning on the P-FET are not easily removed and remain when turning off the P-FET. Thus, the length of the channel of the P-FET on the interface is gradually reduced, thereby decreasing threshold voltage and breakdown voltage. Consequently, the characteristics of the P-FET are undesirably altered.

SUMMARY OF THE INVENTION

To solve the above problems, the present invention provides a semiconductor device having a shallow trench isolation (STI) structure, which can reduce leakage current of the semiconductor device around an STI layer.

The present invention also provides a method of manufacturing of the semiconductor device having the STI structure.

According to a first embodiment of the present invention, the semiconductor device having an STI structure includes a semiconductor substrate having a plurality of trenches providing isolation in a cell area in which memory devices are formed, and in non-cell areas, e.g., core or peripheral areas in which P-FETs and other circuit devices are formed. A first sidewall oxide layer is formed on the inner surfaces of the plurality of trenches. A second sidewall oxide layer is formed on first sidewall oxide layer in one or more of the plurality of trenches in the non-cell areas. A first relief liner is formed on the first sidewall oxide layer in one or more of the plurality of trenches in the cell area. A second relief liner is formed on the first relief liner and also on the second sidewall oxide layer. The plurality of trenches are filled with a dielectric material.

According to a second embodiment of the present invention, the semiconductor device having an STI structure includes a semiconductor substrate having a plurality of trenches for isolating a cell area in which memory devices are formed and core or peripheral areas in which a P-FET and other circuit devices are formed and between devices formed in respective areas. A first sidewall oxide layer is formed on the inner surfaces of the plurality of trenches. A second sidewall oxide layer is formed on the first sidewall oxide layer in one or more of the plurality of trenches isolating between P-FETs in the core or peripheral areas. A first relief liner is formed on the first sidewall oxide layer in one or more of the plurality of trenches isolating between memory devices in the cell area and between the other circuit devices in the core or peripheral areas. A second relief liner is formed on the first relief liner, and also on the second sidewall oxide layer. The plurality of trenches are filled with a dielectric material. The first sidewall oxide layer has a thickness of about 20~50 Å. The second sidewall oxide layer has a thickness of about 50~100 Å. The first and second relief liners are formed of silicon nitride or silicon oxynitride. The dielectric material is a HDP layer or a TEOS layer.

According to another aspect of the present invention, a method of manufacturing a semiconductor device having an STI structure is as follows. There is provided a semiconductor substrate including a cell area in which memory devices are formed and non-cell areas, e.g., core or peripheral areas in which a P-FET and other circuit devices are formed. A blocking pattern is formed on the semiconductor substrate to expose a predetermined area for defining the cell, core or peripheral areas of the semiconductor substrate and for isolating between devices in respective areas. A plurality of trenches are formed by etching a pre-isolation area of the exposed semiconductor substrate to a predetermined depth using the blocking pattern as a mask. A first sidewall oxide layer is formed on the inner surfaces of the plurality of trenches. A first relief liner is formed over the first sidewall oxide layer. A region of the first sidewall oxide layer is exposed by removing a portion of the first relief liner formed in a selected area including a trench providing isolation between P-FETs among the plurality of trenches. A second sidewall oxide layer is selectively formed on the exposed surface of the first sidewall oxide layer. A second relief liner is formed on the first relief liner and also on the second sidewall oxide layer. A dielectric material is deposited to fill the plurality of trenches. An STI layer is formed by planarizing the dielectric layer, the relief liners, and the blocking pattern.

The first and second sidewall oxide layers are formed by a thermal oxidation method. The first and second relief liners are formed of silicon nitride or silicon oxynitride. The first relief liner in the selected area is removed by an isotropic etching method.

The selected area may include a trench isolating between P-FETs in the core or peripheral areas.

Forming the blocking pattern may include forming a pad oxide layer on the semiconductor substrate, forming a silicon nitride layer on the pad oxide layer, and patterning the silicon nitride layer and the pad oxide layer to expose the predetermined area.

According to the present invention, the STI layer, which provides isolation between the core or peripheral areas or between P-FETs in the core or peripheral areas, has a relatively thick sidewall oxide layer. The STI layer formed in the cell area has a relatively thick relief liner.

Because the sidewall oxide layer of the STI layer isolating between P-FETs in the core or peripheral areas is relatively thick, the electrons trapped in the relief liner and on the interface between the liner and the sidewall oxide layer are widely distributed and holes induced from the electrons are also widely distributed on the outer face. Consequently, a current path is not formed. As a result, a leakage current path between adjacent P-FETs is not generated. Also, the threshold voltage and breakdown voltage characteristics of the P-FET on the interface are not deteriorated.

In addition, as the relief liner of the STI layer formed in the cell area is relatively thick, the thick relief liner prevents the penetration of the defects generated in the cell area into the STI layer. Consequently, an STI layer having excellent dielectric characteristics can be provided.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
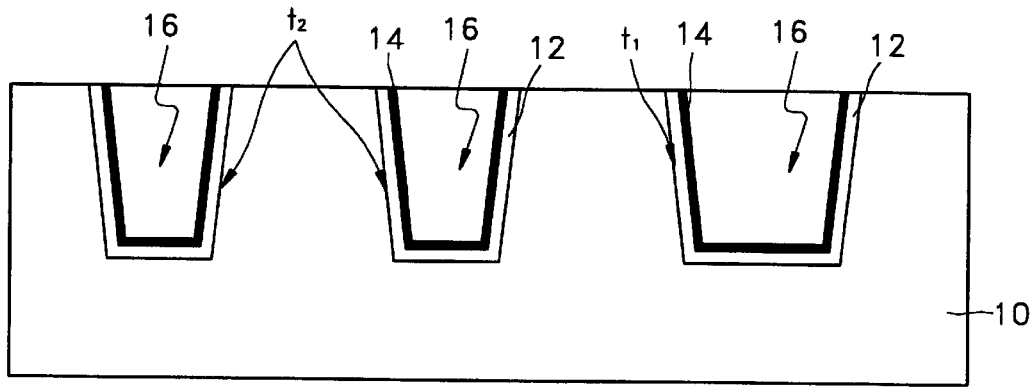
FIG. 1 is a cross-sectional view for describing a semiconductor device having a conventional STI structure.
Figure 2A:
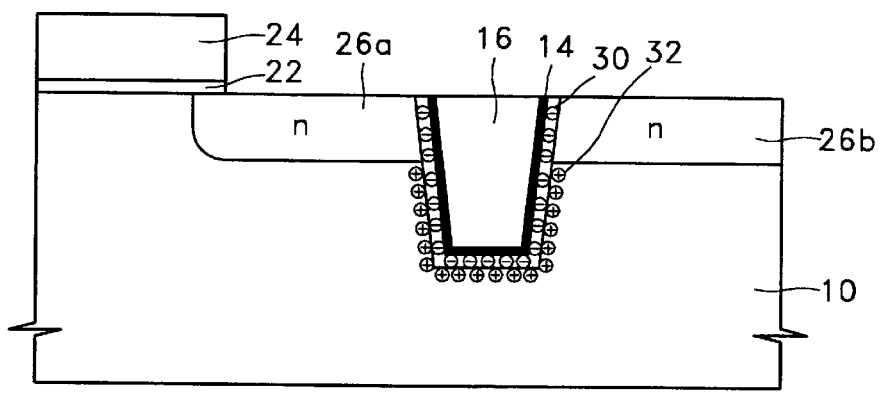
FIG. 2A is a cross-sectional view illustrating an N-FET isolated by the conventional STI structure.
Figure 2B:
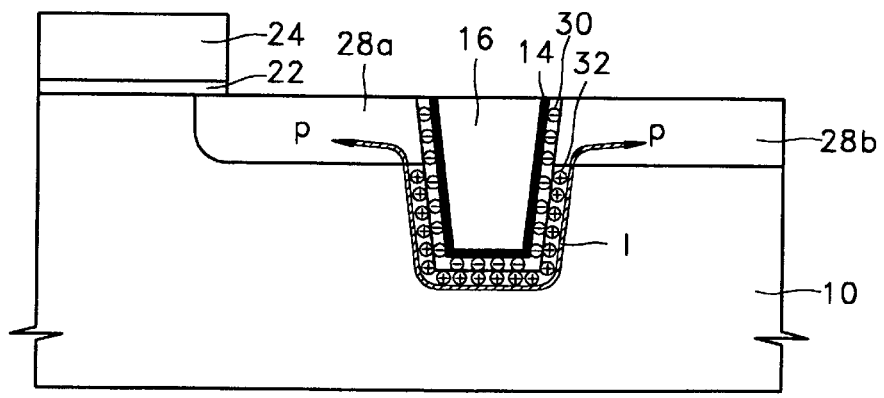
FIG. 2B is a cross-sectional view illustrating a P-FET isolated by the conventional STI structure.

Hereinafter, preferred embodiments of the present invention will be described in detail with reference to the attached drawings. However, the embodiments of the present invention can be modified into various other forms, and the scope of the present invention must not be interpreted as being restricted to the embodiments. The embodiments are provided to more completely explain the present invention to those skilled in the art. In the drawings, the thicknesses of layers and regions are exaggerated for clarity. Like reference numerals in the drawings denote the same members. Also, when it is written that a layer is formed "on" another layer or a substrate, the layer can be formed directly on the other layer or the substrate, or other layers can intervene therebetween.

Embodiment 1

Figure 3A:
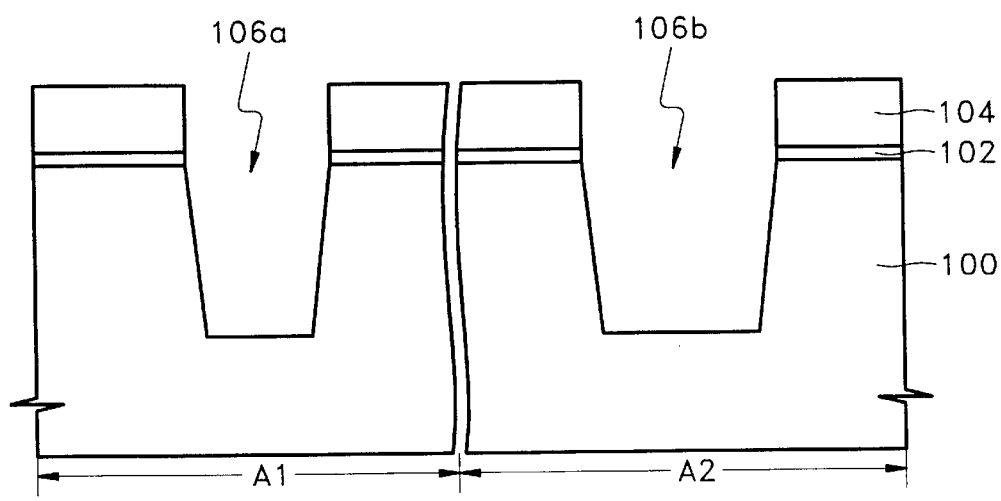
FIGS. 3A through 3E are cross-sectional views showing a manufacturing method of a semiconductor device having an STI structure according to a first embodiment of the present invention.

First, referring to FIG. 3A, a pad oxide layer 102 and a silicon nitride layer 104 are sequentially stacked over a semiconductor substrate 100. The semiconductor substrate 100, which is a silicon substrate containing selected impurities, includes a cell area in which a memory device will be formed and further includes core or peripheral areas in which P-FETs will be formed. A1 is a cell area and A2 is non-cell areas, e.g., core or peripheral areas. The pad oxide layer 102 is formed to a thickness of about 70~160 Å and the silicon nitride layer 104 is formed to a thickness of about 1300~1600 Å. Next, the silicon nitride layer 104 and the pad oxide layer 102 are etched using a conventional photolithography process to expose a pre-isolation area of the semiconductor substrate 100, thereby forming a blocking pattern. Here, "pre-isolation area" means an area for defining the cell, core or peripheral areas and isolating between devices in respective areas. Afterwards, the semiconductor substrate 100 is etched to a depth of about 0.1~1.5 $\mu$m using the blocking pattern as a mask, thereby forming a first trench 106a and a second trench 106b. The first and second trenches 106a and 106b are shallow trenches for forming shallow trench isolation (STI) structures. Also, the first trench 106a provides isolation between devices in the cell A1 and the second trench 106b provides isolation between devices in the core or peripheral areas A2. Moreover, the first trench 106a is formed in the cell area A1, which has a high device density. Thus the first trench 106a is narrower than the second trench 106b formed in the core or peripheral areas A2. The etching process for forming the first and second trenches 106a and 106b may be a dry etching process using a plasma, which may cause silicon lattice defects and damage to the surfaces of the first and second trenches 106a and 106b, increasing leakage current. Also, sharp corners of the first and second trenches 106a and 106b may be generated.

Figure 3B:
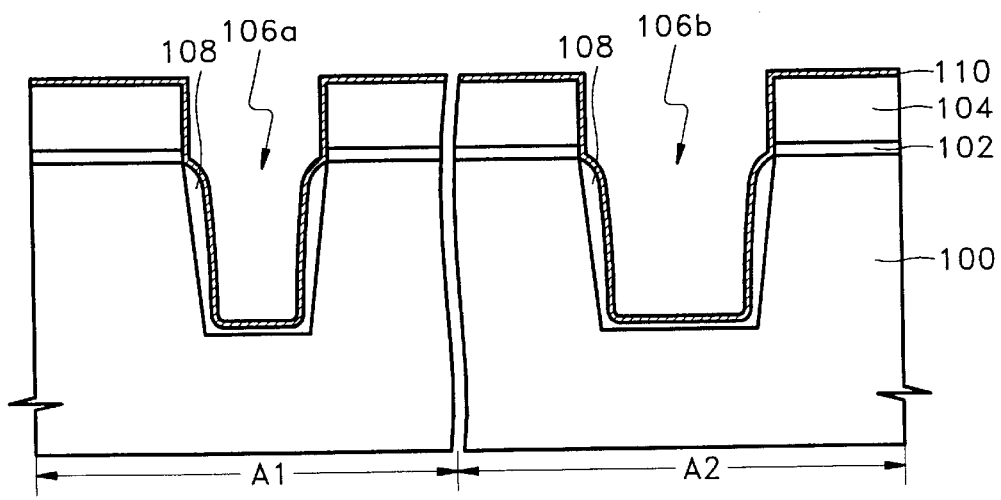

Next, as shown in FIG. 3B, a first sidewall oxide layer 108 is formed in the first and second trenches 106a and 106b by thermally oxidizing the inner surfaces of the first and second trenches 106a and 106b to cure the silicon lattice defects and damage generated in the first and second trenches 106a and 106b and remove the sharp corners. Here, the first sidewall oxide layer 108 is formed to a thickness of about 20~240 Å, more preferably to a thickness of about 20~50 Å in consideration of high integration of a semiconductor device. Afterwards, a first relief liner 110 is formed over the semiconductor substrate 100 on which the first sidewall oxide layer 108 is formed. The relief liner 110 relieves stress caused by the CTE mismatch between the silicon semiconductor substrate 100 and an oxide layer with which the trenches 106a and 106b will be filled, and blocks the penetration of defects generated in an active area into the trenches 106a and 106b. A silicon nitride layer or a silicon oxynitride layer may be formed a thickness of 50~100 Å, as the relief liner 110.

Figure 3C:
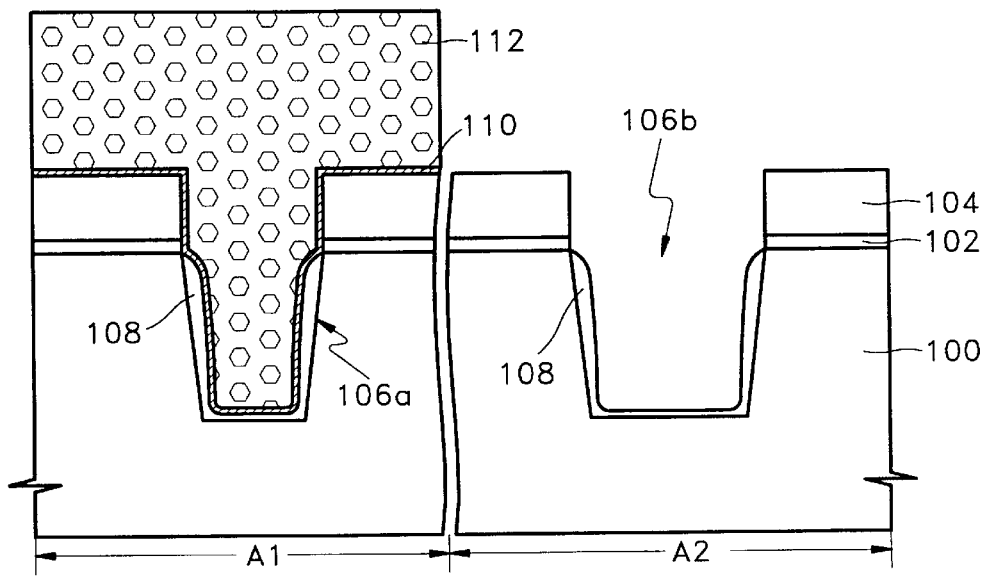

With reference to FIG. 3C, a photoresist pattern 112 is formed by a conventional photolithography process to cover the cell area A1. As a result, the core or peripheral areas A2 are exposed. Afterwards, the first sidewall oxide layer 108 in the core or peripheral areas A2 is exposed by removing the first relief liner 110 in the exposed core or peripheral areas A2. Here, the first relief liner 110 is wet etched with etchants such as a phosphoric acid solution to be etched isotropically. The first relief liner 110 may be also etched by an isotropic dry etching method.

Figure 3D:
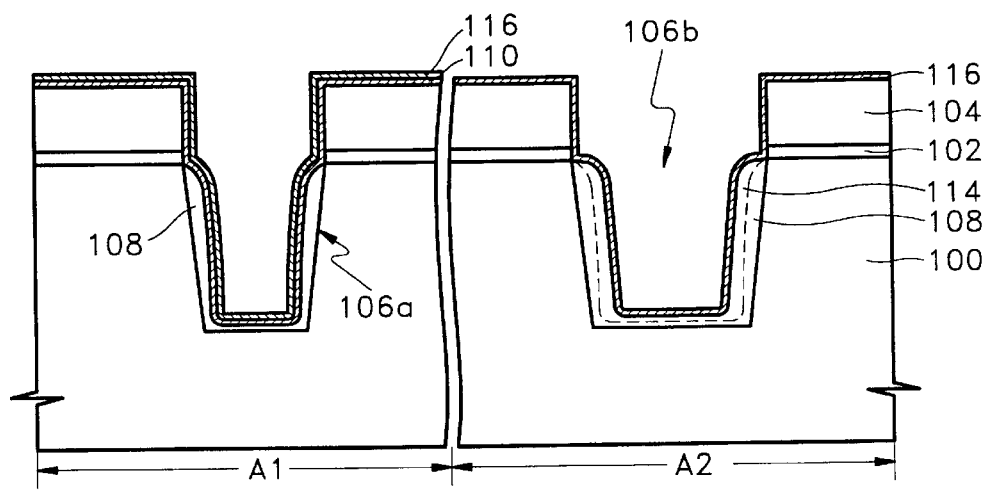

Afterwards, as shown in FIG. 3D, the photoresist pattern 112 is removed by a known method. Next, the resultant semiconductor substrate 100 is thermally oxidized to form a second sidewall oxide layer 114 on the first sidewall oxide layer 108 in the core or peripheral areas A2. The cell area A1 is covered with the first relief liner 110 formed of silicon nitride or silicon oxynitride. Thus, although the entire surface of the semiconductor substrate 100 is thermally oxidized, an oxide layer is not grown on the surface of the first relief liner 110 but only on the exposed first sidewall oxide layer 108. Here, the second sidewall oxide layer 114 is formed to a thickness of about 50~150 Å. Afterwards, a second relief liner 116 is formed over the resultant semiconductor substrate 100 to a thickness of about 50~150 Å. As a result, in the cell area A1, the sidewall oxide layer 108 is a single layer of about 20~50 Å thick and the relief liners 110 and 116 make a double layer of about 100~200 Å thick. In the core or peripheral areas A2, the sidewall oxide layers 108 and 114 are a double layer of about 70~200 Å thick and the relief liner 116 is a single layer of about 50~100 Å thick. In the cell area A1, the relief liner is relatively thicker than in other areas and the sidewall oxide layer in the core or peripheral areas A2 is relatively thicker than in the cell area.

Figure 3E:
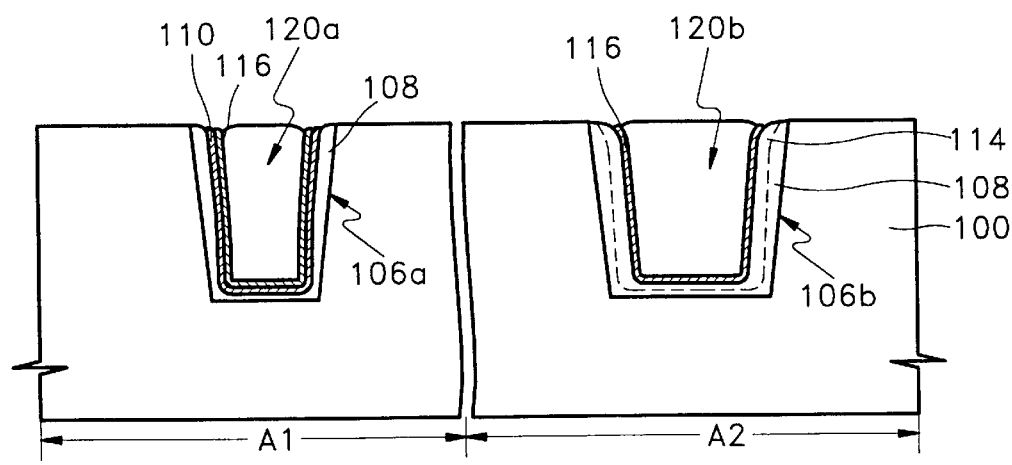

Next, with reference to FIG. 3E, a dielectric layer is formed over the semiconductor substrate 100 to a thickness of 5000~7000 Å to fill the first and second trenches 106a and 106b. At this time, a HDP dielectric layer or a TEOS layer having an excellent interlevel-filling property may be used as the dielectric layer. Next, a planarization process such as a CMP process is performed on the dielectric layer, the first and second relief liners 110 and 116, the silicon nitride layer 104, and the pad oxide layer 102 until the surface of the semiconductor substrate 100 is exposed. As a result, the first and second trenches 106a and 106b are filled with the dielectric layer and thus first and second STI layers 120a and 120b are completed. Here, a thermal treatment may be performed at a high temperature of more than about 900° C. before the CMP process to prevent generation of recesses on the first and second STI layers 120a and 120b due to the CMP process. Consequently, the dielectric layer becomes denser because of the high temperature thermal treatment and is not easily lost during the CMP process.

Figure 4A:
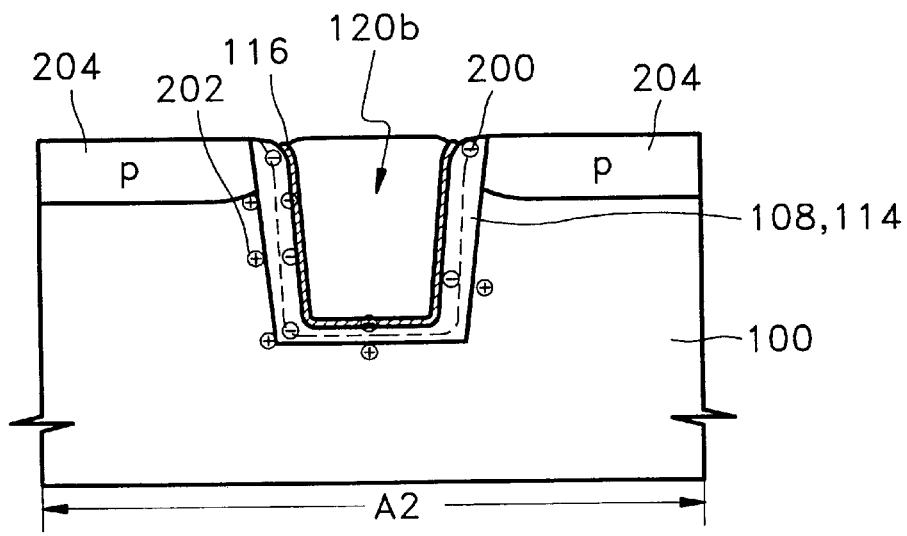
FIG. 4A is a cross-sectional view of a portion of a P-FET isolated by the STI structure according to the first embodiment of the present invention.

According to the present embodiment, the sidewall oxide layer of the second STI layer in the core or peripheral areas A2 is relatively thicker than in the cell area. As a result, as shown in FIG. 4A, electrons 200 are randomly trapped in the liner 116 and on the interface between the liner 116 and the sidewall oxide layers 108 and 114, and holes 202 induced by electrons are randomly arranged around the STI layer 102b. In this case, as the holes 202 are randomly arranged, a current path is not formed in series. Consequently, leakage current does not occur between junction areas of adjacent P-FETs reference numeral 204 denotes the p-type junction areas.

Figure 4B:
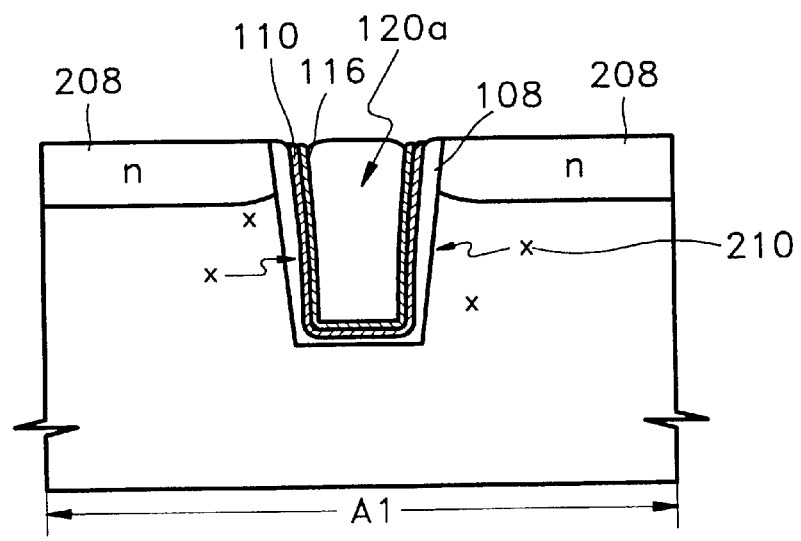
FIG. 4B is a cross-sectional view of a portion of an N-FET isolated by the STI structure according to the first embodiment of the present invention.

Also, according to the present embodiment, the relief liner of the first STI layer 102a in the cell area A1 is relatively thick. As a result, as shown in FIG. 4B, the thick relief liners 110 and 116 prevent the penetration of defects generated in a N-FET into the STI layer 120a. At this time, defects may be generated in a P-FET during fabrication processes. However, an area having the P-FET is formed in the core or peripheral areas in which devices are sparsely arranged. Therefore, although defects can be generated in the P-FET reference numeral 204 denotes the p-type junction areas, generally, they do not penetrate into the STI layer 120b reference numeral 208 denotes the n-type junction areas.

Embodiment 2

The manufacturing method of this embodiment is essentially the same as the above described embodiment 1 except in the location of the STI layer.

Figure 5:
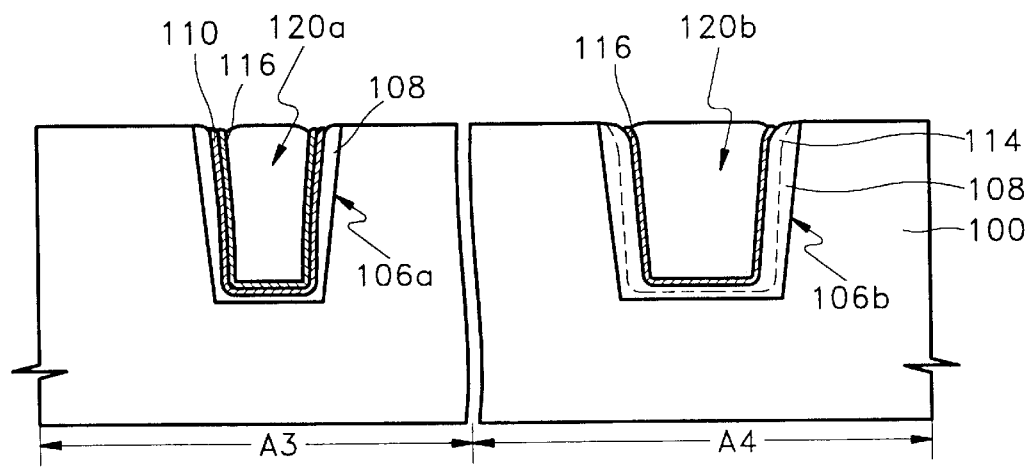
FIG. 5 is a cross-sectional view of a semiconductor device having an STI structure showing a second embodiment of the present invention.

That is, as shown in FIG. 5, the second STI layer 120b, on which the sidewall oxide layer is relatively thick, is formed only in an area of isolation between P-FETs in the core or peripheral areas. In addition, the first STI layer 120a, on which the relief liner is relatively thick, is formed in the cell area as well as in an area of isolation between other circuit devices, except P-FETs in the core or peripheral areas.

Here, the manufacturing method of the present embodiment may for the most part be the same as the above-mentioned embodiment 1. However, the photoresist pattern for removing the relief liner is formed so that only a trench defining P-FETs is exposed. The other processes of this embodiment are the same as those of embodiment 1. Here reference numeral A3 denotes an area in which other circuits except for a P-FET in the cell area and the core or peripheral areas are formed. Also, reference numeral A4 denotes an area isolating between the P-FETs.

This embodiment achieves the same effects as the above-described embodiment 1.

Embodiment 3

The processes after the formation of the trench of the present embodiment are the same as the aforementioned embodiment 1 except in the processes before the formation of the trench. Like reference numerals in the embodiment 1 denote the same members.

Figure 6:
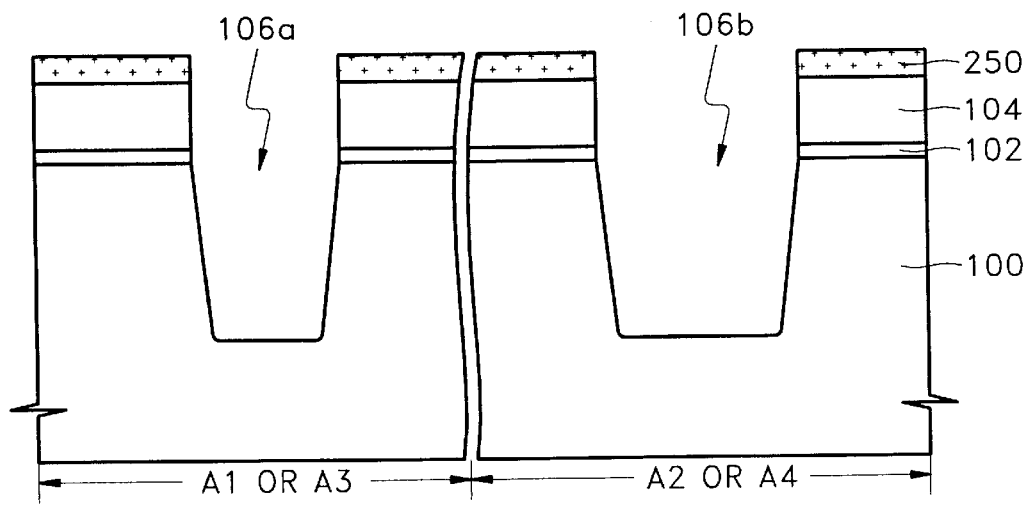
FIG. 6 is a cross-sectional view of a semiconductor device having an STI structure showing a third embodiment of the present invention.

With reference to FIG. 6, a pad oxide layer 102 and a silicon nitride layer 104 are sequentially stacked over a semiconductor substrate 100. Afterwards, an anti-reflection film 250 is deposited on the silicon nitride layer 104 to prevent reflection from the silicon nitride layer 104 during a subsequent photolithography process. At this time, a silicon oxynitride (SiON) layer may be used as the anti-reflection film 250, which may be formed to a thickness of 600~700 Å.

Next, the anti-reflection film 250, the silicon nitride layer 104, and the pad oxide layer 102 are etched using a known photolithography process to expose a pre-isolation area of the semiconductor substrate 100. Afterwards, the semiconductor substrate 100 is etched to a depth of 0.1~1.5 μm using the silicon nitride layer 104 as a mask, thereby forming first and second trenches 106a and 106b. Here, the first trench 106a is formed in the cell area A1 or an area A3, except for an area isolating between P-FETs in the cell, core or peripheral areas. Also, the second trench 106b is formed in the core or peripheral areas A2 or an area A4 isolating between P-FETs in the core or the peripheral areas.

Forming the anti-reflection film 250 on the silicon nitride layer 104 in forming the pattern for defining the trench prevents a notching phenomenon in a photolithography process.

As described above, according to the present invention, the STI layer, which provides electrical isolation between the core or peripheral areas or between P-FETs in the core or peripheral areas, has a relatively thick sidewall oxide layer. The STI layer formed in the cell area has a relatively thick relief liner.

Because the sidewall oxide layer of the STI layer isolating between P-FETs in the core or peripheral areas is relatively thick, the electrons trapped in the relief liner and on the interface between the liner and the sidewall oxide layer are widely distributed and holes induced from the electrons are also widely distributed on the outer surface. Consequently, a current path is not formed. As a result, a leakage current path between adjacent P-FETs is not generated. Also, the threshold voltage and breakdown voltage characteristics of the P-FET on the interface are not degraded.

In addition, as the relief liner of the STI layer formed in the cell area is relatively thick, the thick relief liner prevents the penetration of the defects generated in the cell area into the STI layer. Consequently, an STI layer having excellent dielectric characteristics can be provided.

Although the invention has been described with reference to preferred embodiments, it will be apparent to one of ordinary skill in the art that modifications of the described embodiments may be made without departing from the spirit and scope of the invention.

What is claimed is:

1. A semiconductor device having a shallow trench isolation (STI) structure, comprising:

a semiconductor substrate having first and second trenches, the first trench formed in a cell area;

a first sidewall oxide layer formed on inner surfaces of the first and second trenches;

a second sidewall oxide layer directly formed on the first sidewall oxide layer in the second trench;

a first relief liner formed on the first sidewall oxide layer in the first trench;

a second relief liner directly formed on the first relief liner in the first trench, and also formed on the second sidewall oxide layer in the second trench; and a dielectric material formed within the first and second trenches.

2. The semiconductor device of claim 1, wherein the first sidewall oxide layer has a thickness of about 20~50 Å.

3. The semiconductor device of claim 2, wherein the second sidewall oxide layer has a thickness of about 50~100 Å.

4. The semiconductor device of claim 1, wherein the first and second relief liners are formed of silicon nitride or silicon oxynitride.

5. The semiconductor device of claim 1, wherein the dielectric material is a HDP layer or a TEOS layer.

6. The semiconductor device of claim 1, wherein the second trench is formed in a core or peripheral area.

7. The semiconductor device of claim 6, wherein the first trench is narrower than the second trench.

8. The semiconductor device of claim 1, wherein the total thickness of the first and second sidewall oxide layers formed in the second trench is substantially thicker than the thickness of the first sidewall oxide layer formed in the first trench.

9. The semiconductor device of claim 1, wherein the total thickness of the first and second relief liners formed in the first trench is substantially thicker than the thickness of the first relief liner formed in the second trench.

10. A semiconductor device having an STI structure, comprising:

a semiconductor substrate having a plurality of trenches in a cell area in which memory devices are formed, and in non-cell areas in which P-FETs and other circuit devices are formed;

a first sidewall oxide layer formed on inner surfaces of the plurality of trenches;

a second sidewall oxide layer directly formed on the first sidewall oxide layer in one or more of the plurality of trenches, the one or more of the trenches isolating between the P-FETs in the non-cell areas;

a first relief liner formed on the first sidewall oxide layer in the plurality of trenches except in the one or more of the plurality of trenches isolating between the P-FETs in the non-cell areas;

a second relief liner directly formed on the first relief liner, and also formed on the second sidewall oxide layer; and a dielectric material formed within the plurality of trenches.

11. The semiconductor device of claim 10, wherein the first sidewall oxide layer has a thickness of about 20~50 Å.

12. The semiconductor device of claim 11, wherein the second sidewall oxide layer has a thickness of about 50~100 Å.

13. The semiconductor device of claim 10, wherein the first and second relief liners are formed of silicon nitride or silicon oxynitride.

14. The semiconductor device of claim 10, wherein the dielectric material is a HDP layer or a TEOS layer.

* * * * *